(12) United States Patent
Coskun et al.

(10) Patent No.: US 10,115,687 B2
(45) Date of Patent: Oct. 30, 2018

(54) METHOD OF PATTERN PLACEMENT CORRECTION

(71) Applicant: Applied Materials, Inc., Santa Clara, CA (US)

(72) Inventors: Tamer Coskun, San Jose, CA (US); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/424,366

(22) Filed: Feb. 3, 2017

(65) Prior Publication Data
US 2018/0226369 A1    Aug. 9, 2018

(51) Int. Cl.
*H01L 21/66* (2006.01)
*H01L 23/00* (2006.01)
*G03F 7/20* (2006.01)

(52) U.S. Cl.
CPC .......... *H01L 24/02* (2013.01); *G03F 7/70625* (2013.01); *H01L 22/20* (2013.01); *H01L 2224/02313* (2013.01); *H01L 2224/02321* (2013.01)

(58) Field of Classification Search
CPC .............................. H01L 24/02; G03F 7/70625
See application file for complete search history.

(56) References Cited

U.S. PATENT DOCUMENTS

| 2008/0273184 | A1  | 11/2008 | Morimoto et al. | |
|---|---|---|---|---|
| 2009/0073403 | A1* | 3/2009 | De Mol | G03F 9/7003 355/53 |
| 2016/0086825 | A1* | 3/2016 | Scanlan | H01L 23/544 438/15 |

FOREIGN PATENT DOCUMENTS

| JP | H09283404 A | 10/1997 |
|---|---|---|
| JP | H10199794 A | 7/1998 |
| JP | H10294260 A | 11/1998 |
| JP | 2001077012 A | 3/2001 |

OTHER PUBLICATIONS

International Search Report and Written Opinion for PCT/US2017/064686 dated Mar. 27, 2018.

* cited by examiner

*Primary Examiner* — Julio J Maldonado
*Assistant Examiner* — Andreé C Stevenson
(74) *Attorney, Agent, or Firm* — Patterson + Sheridan LLP

(57) ABSTRACT

In one embodiment of the invention, a method for correcting a pattern placement on a substrate is disclosed. The method begins by detecting three reference points for a substrate. A plurality of sets of three die location points are detected, each set indicative of an orientation of a die structure, the plurality of sets include a first set associated with a first dies and a second set associated with a second die. A local transformation is calculated for the orientation of the first die and the second on the substrate. Three orientation points are selected from the plurality of sets of three die location points wherein the orientation points are not set members of the same die. A first global orientation of the substrate is calculated from the selected three points from the set of points and the first global transformation and the local transformation for the substrate are stored.

12 Claims, 3 Drawing Sheets

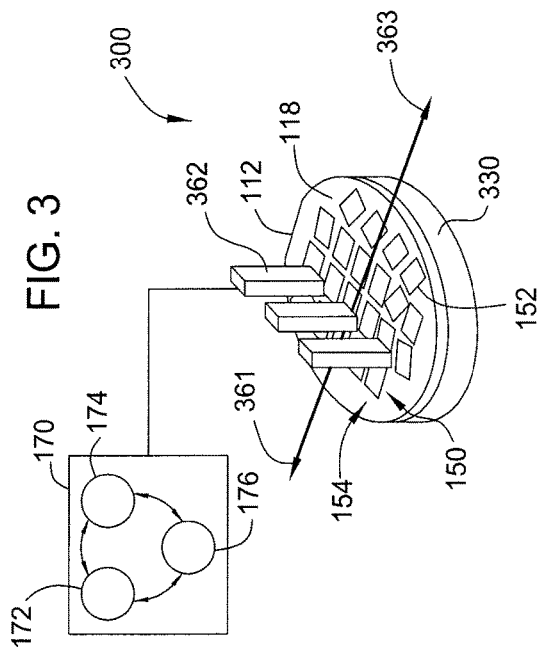
FIG. 1
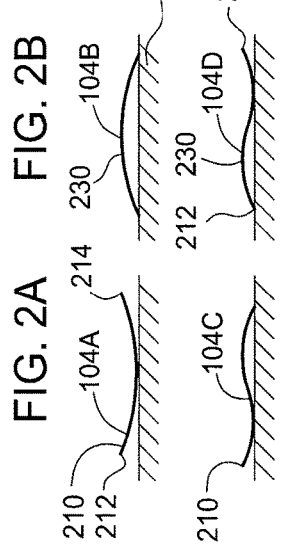
FIG. 2A
FIG. 2B
FIG. 2C
FIG. 2D
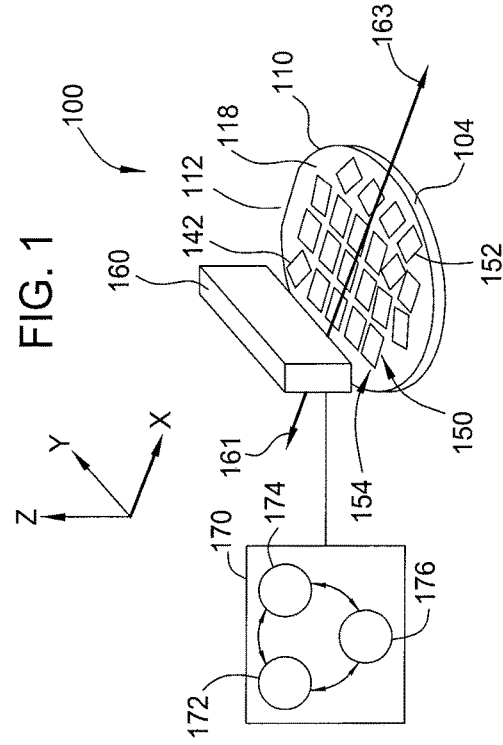
FIG. 3

METHOD OF PATTERN PLACEMENT CORRECTION

BACKGROUND

Field

Embodiments of the present disclosure generally relate to methods for processing one or more substrates, and more specifically to methods for performing photolithography processes.

Description of the Related Art

Microlithography techniques are generally employed to create electrical features incorporated as part of a die formed on a substrate. According to this technique, a light-sensitive photoresist is typically applied to a surface of the substrate. Then, a pattern generator exposes selected areas of the light-sensitive photoresist as part of a pattern with light to cause chemical changes to the photoresist in the selective areas to create a mask. The mask is utilized to transfer a pattern during the creation of the electrical features that eventually make up the die.

However, as multiple operations are involved in the formation of the electrical features, high placement accuracy for masks forming the individual dies are required to align the connections. The placement accuracy requirement limits throughput and increase cost. Warpage of the substrate, among other issues, can lead to connection misplacement in the individual dies. Excessive die drift during pick-and-place operation also contribute to yield loss. Thus, misplacing cingulated chips to form a molded panel can lead to pattern overlay difficulties in the buildup process when traditional lithography is used.

Therefore, there is a need for an improved system and method for photolithography.

SUMMARY

In one embodiment of the invention, a method for correcting a pattern placement on a substrate is disclosed. The method begins by detecting three reference points for a substrate. A plurality of sets of three die location points are detected, each set indicative of an orientation of a die structure, the plurality of sets include a first set associated with a first dies and a second set associated with a second die. A local transformation is calculated for the orientation of the first die and the second on the substrate. Three orientation points are selected from the plurality of sets of three die location points wherein the orientation points are not set members of the same die. A first global orientation of the substrate is calculated from the selected three points from the set of points and the first global transformation and the local transformation for the substrate are stored.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic view of a substrate disposed in a metrology system.

FIGS. 2A-2D depict various profiles for the substrate of FIG. 1.

FIG. 3 is a schematic view of the substrate disposed in a photolithography system.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 4:
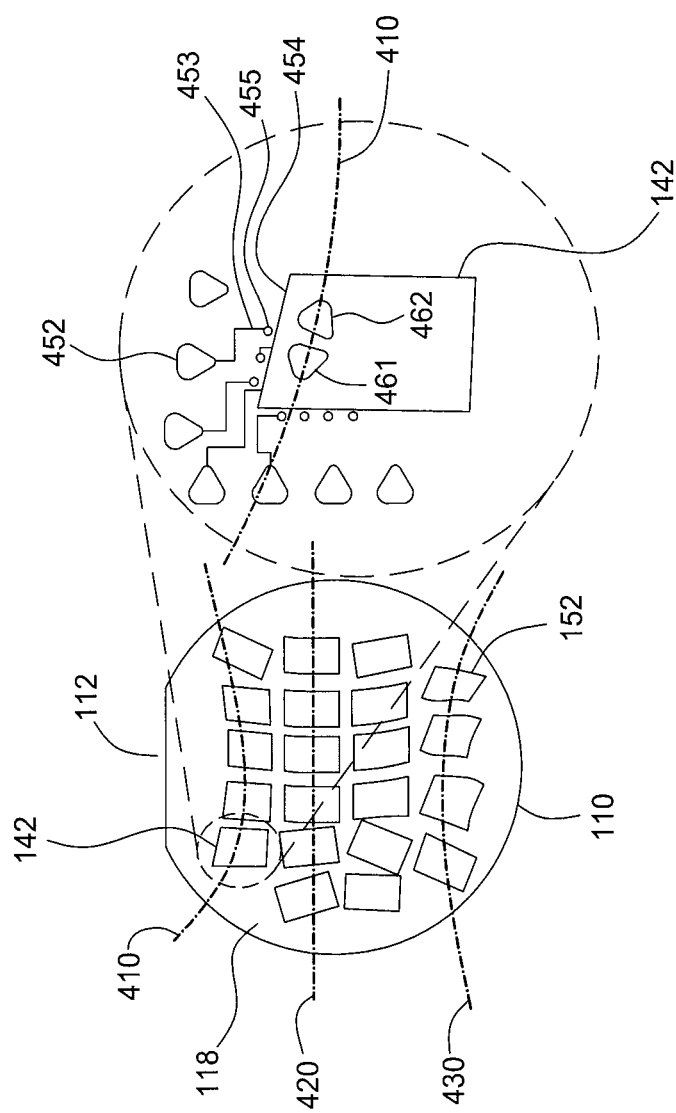
FIG. 4 is a schematic view depicting features of a die on the substrate.

The present invention includes methods and apparatus for correcting a pattern placement on a substrate during a photolithography processes. In one embodiment, the substrate is transferred to a metrology tool. The substrate is measured to determine die locations on the substrate, skew of the dies, warpage of the substrate, and other pattern mappings. The substrate is subsequently moved to a digital lithography system for processing therein. Die misplacement on the substrate is corrected by applying a per-die digital mask alignment correction. Correction for substrate warpage induced placement errors of each die is performed by applying a model based pattern placement correction algorithm based on the measurements taken from the metrology tool.

FIG. 1 is a schematic view of a substrate 104 disposed in a metrology system 100. The metrology system 100 may have a scanner 160. The scanner 160 may move in a first direction 161 and a second direction 163 to fully measure the substrate 104. The scanner 160 may utilize a laser, optical or acoustical sensor or other techniques for measuring location information associated with structures, such as dies, formed on the substrate 104.

The metrology system 100 may have a controller 170. Alternately, the metrology system 100 may be coupled to the controller 170. The controller 170 may have a central processing unit 172 and memory 174. The controller 170 may optionally have input output devices 176 from which the controller 170 may interface with other devices as humans. The memory 174 may store program code for running on the CPU 172. The memory 174 may additionally store information such as measurements and process parameters associated with the substrate 104.

The substrate 104 may have an outer edge 110, a top surface 118 and a notch 112. The notch 112 may be used to orient the substrate 104. The substrate 104 may have a plurality of dies 152 disposed on the top surface 118. The dies 152 may be arranged in rows 154 and columns 150. Alternately, the dies 152 may be arranged in other suitable configurations, such as radially or in concentric circles.

The scanner 160 may move across the substrate 104 to provide measurements, such as along an X, Y and Z Cartesian coordinate or along a polar coordinate, for each of the dies 152, among other features on the substrate 104. For example, the scanner 160 may measure locations along or in a first die 142. The scanner 160 may additionally measure reference marks (not shown) on the substrate 104. The measurements may be stored in memory 174 and associated with one or more substrates 104. The information stored in the memory 174 may be made accessible to other processing equipment such as a photolithography system described below with reference to FIG. 3.

The measurements from the metrology system 100 may be used to determine whether the locations of the dies 152 are skewed or misaligned compared to a predicted or planned layout for the dies 152. The measurements from the metrology system 100 may also be used to develop a global profile, i.e., shape, of the substrate 104. For example, the global profile may indicate and correct for warpage. FIGS. 2A-2D depict example for global profiles of the substrate 104 shown in FIG. 1. It should be appreciated that the substrate 104 may have alternate global profiles which may be modeled with the measurement data from the metrology system and the examples provided herein are merely to convey an understanding of the global profiles one or more substrates 104 may have.

High order warpage effects can be presented in different forms such as shown in FIGS. 2A through 2D. Warpage of the substrate is characterized by high order global 2D models whereas die misplacement/location may be modeled by linear models. Correction may be selectively applied in different regions of the substrate corresponding to individual die locations or along a surface prescribed by the global 2D model. However, it should also be appreciated that the warpage and die locations may alternately utilize 3D models for determining the locations and profile thereof.

FIG. 2A illustrates a substrate 104A resting on a planar surface 290. The substrate 104A may have a concave profile wherein edges 210 are curved upwards and away from the planar surface 290. For example, the concave profile may appear to have the shape of a dish. FIG. 2B illustrates a substrate 104B resting on the planar surface 290. The substrate 104B may have a convex profile wherein the edges 210 are in contact with the planar surface 290 and a mid-portion 230 of the substrate 104 is elevated upwards away from the planar surface 290. For example, the convex profile may appear to have an upside down dish shape. Additionally, the warpage may include a combination of two or more of the profiles. Such a profile may present itself as a sinusoid or other curve type shape. FIG. 2C illustrates a substrate 104C resting on a planar surface 290. The substrate 104C may have a sinusoidal profile wherein a first edge 212 is elevated off the planar surface 290 and a second edge 214 is disposed thereon. FIG. 2D illustrates a substrate 104D resting on a planar surface 290. The substrate 104D may have a sinusoidal profile extending beyond a single period. For example the first edge 212, second edge 214 and mid-portion 230 may be elevated off the planar surface 290. With other portions of the substrate 104D disposed thereon. The profiles for the substrate 104 shown in FIGS. 2A-2D are merely illustrative and it should be appreciated that other profiles, both simple and complex, may be present on the substrate and modeled.

The measurements from the metrology system may be utilized to model the substrate 104 and correct for misplaced die locations on the substrate as well as warpage during further processing. For example, the measurements may be utilized to form a local level die model for determining x/y rotation, expansion, and shift (local transformation) per die. The model may use at least three points on each and every die for calculating such a model. The points of measurement associated with a particular die may correspond to a set. For example, there may be 'n' set of measurement points corresponding to the number of dies on the substrate 104. Additionally, a global model may be developed for the substrate 104 indicating warpage or global x/y rotation, expansion, and shift of the entire top surface 118 of the substrate 104 (i.e., global transformation). The global model may utilize at least three points, each point from a different set of die measurements, three separate alignment marks, or other distal reference measurements, to calculate the global transformation. The combination of the local transformation along with the global transformation is used to modify processing parameters to ensure greater accuracy of alignment for die level operations, such as a photolithography operation.

FIG. 3 is a schematic view of the substrate 104 disposed in a photolithography system 300. The photolithography system 300 may include a pair of tracks supported by a pair of the supports. Two or more chucks 330 may move along the tracks in a first direction 361 and a second direction 363. The track and the supports may be lifted by an air bearing system, magnetic channels or by other suitable techniques during operation. The chuck 330 may be a vacuum chuck that secures the substrate 104 thereto. The difference in location between the chuck 330 and the substrate 104 when secured thereto is minimal.

The photolithography system 300 may include an encoder for measuring the location information of the substrate 104 disposed on the one or more chucks 330. The location of the substrate 104 on the chuck 330 may also be measured during operation by a plurality of interferometers. The interferometers may be aligned with mirrors located closer to the substrate in the Z-direction, i.e., vertical direction, than the encoder. The interferometers may be any suitable interferometers, such as high stability plane mirror interferometers. The location information of the substrate 104 measured by the interferometers or encoder may be provided to a controller 170 which may additionally control the motion of the chuck 330. The controller 170 may be electronically coupled with the metrology system 100 and communicate therewith information about the substrate 104. For example, the metrology system 100 may provide measurement information suitable for calculating a global and local transformation about the substrate 104 to the controller 170.

The photolithography system 300 may include one or more processing units 362. The processing unit 362 may communicate with the aforementioned controller 170. The processing unit 362 may be supported by a support. The two or more chucks may pass under the processing unit 362. In one embodiment, the processing unit 362 is a pattern generator configured to expose a photoresist in a photolithography process. In some embodiments, the processing unit 362 may be configured to perform a maskless lithography process. The processing unit 362 is utilized to generate a maskless direct patterning of the substrate 104. The processing unit 362 may include a plurality of image projection systems disposed in a case. During operation, one or more chucks 330 may move from a loading position and pass under the processing unit 362. The chuck may also move in an orthogonal direction by moving along a second track for processing and/or indexing the substrate 104. Alternately, the processing unit 362 may move in a first direction and/or a second direction over the chuck 330 for processing and/or indexing the substrate 104 disposed on the chuck 330.

The metrology system 100 and the photolithography system 300 may work in concert for correcting die misplacement on the substrate 104 by using measurement information from the metrology system 100 to adjust the digital mask provided by the processing unit 362 during a photolithography process. The photolithography system 300 may detect three or more reference points to calculate a second global transformation for the substrate 104. In general, this is different than the global transformation obtained from the metrology system 100. The second global transformation is combined with per die local transformation from the metrology system 100 to calculate an effective transformation for the substrate 104. The effective transformation may be a 2D model representation of the surface of the substrate 104. Alternately, the effective transformation may be a 3D model of the surface of the substrate 104. The effective transformation is applied as a correction to the digital mask of the photolithography system 300 during scanning for printing a layer of material on the substrate 104. If the misplacement signature is repeatable, i.e., the local transformation is consistent from one substrate to a next, offline characterization of each individual substrate 104 by the metrology system 100 can be made faster by measuring only a limited number of dies instead of all the dies. This procedure can also be applied in those cases where full accuracy isn't needed or required, such as where an approximation is sufficient.

FIG. 4 is a schematic view depicting a plurality of dies 152 on the substrate 104. The schematic view is merely representative of the misalignment and skew of dies 152 on the substrate 104. The substrate 104 may have a first row 410, a second row 420 and an $n^{th}$ row 430 of dies 152. The dies 152 on the top surface 118 of the substrate 104 may be misaligned such that the first row 410 of dies 152 may be along a curve (Shown by the dotted line). In contrast, the second row 420 may be more linear aligned as shown by the dotted line. In some embodiments, each of the rows 410, 420 430 may be misaligned with adjacent rows or even different from one substrate 104 to the next substrate. The dies 152 may additionally be skewed from adjacent dies within a respective row 410, 420 430.

The first die 142 may have a plurality of features 452 formed therein or thereon. The first die 142 may have interconnects 453 and vias 455 formed therein. The vias 455 and interconnects 453 may connect features 452 of the first die 142 with other features 452 of the first die 142. Alternately, the features 452, vias 455 and interconnects 453 may be configured to align with features formed on other dies or chips. The local and global transformation may assist in aligning the mask to the features from one operation to the next. For example, the first die 142 may have a first feature 461 and a second feature 462 which are oriented along the first row 410. The local transformation provides position information for the first feature 461 and the second feature 462 such that subsequent operations will align with said features. For example, an etch operation is performed within the critical dimensions for forming a via in the first and second feature 461, 462. Thus, even the misalignment and skew of the dies 152 shown on the substrate 104 may be processed by correcting with the global and local transformation of the substrate 104 and dies 152 introduced above.

Figure 5:
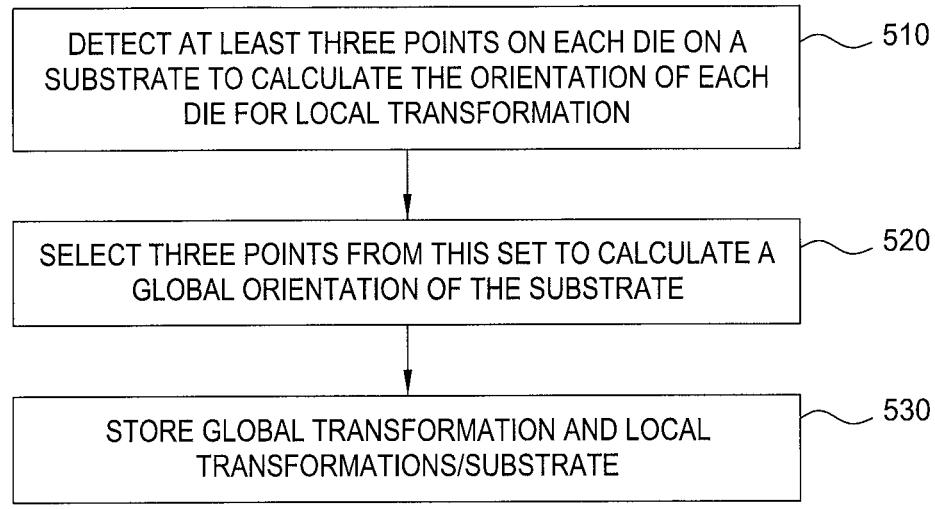
FIG. 5 depicts a method for creating a global transformation for a location of the dies on the substrate.

FIG. 5 depicts a method for creating a global transformation for a location of the dies on the substrate. At operation 510, three or more points are detected on each die on a substrate to calculate the orientation of each die for local transformation. In one embodiment, the three points may be distally spaced far from each other along a perimeter of the die. In a second embodiment, vertices for each die may be detected to more closely determine the shape and orientation of the die. The vertices provide the intersection of each side segment of the die. Thus, the vertices depict the points representing the outer bounds of limits of the area for the die. A set of points may be associated with each die.

At operation 520, at least three points are used to calculate a global transformation of the substrate. The global transformation may be used to characterize warpage or other irregularities in the profile of the substrate. Each of the three points are selected from a different set of the detected points. The three or more sets selected may be distally orientated on the substrate. The global transformation may be calculated from reference points distributed about the substrate. For example, the substrate may have three or more reference points which are not associated with the dies. The reference points may be provided on the top surface of the substrate may be measured and used to calculate the global transformation of the substrate.

In another alternative, calculating the global orientation of the substrate may entail measuring a value for an x/y rotation of the substrate, measuring a value for an expansion of the substrate, measuring a value for an orientation of the dies on the substrate, and calculating the global transformation from the measured values.

In yet another alternative, all detected points from each die may be used to characterize warpage of the substrate by fitting variation to a smooth function. The warpage creates a continuous variation and can be approximated by polynomial while die misplacement is mostly discrete. Additionally, per die models may be created to fit the variation in the substrate modeled by the global transformation. Thus, the two models, i.e., local transformation and global transformation, can be generated together by setting up the combined problem modeled at the per die level. Accordingly, a combined model to capture this per die variation and global warpage effects may be generated.

At operation 530, the global transformation and local transformation of the substrate is stored. The transformations may be stored in memory for access by other equipment. In one embodiment, the transformations are stored on the metrology system and accessed there by other processing equipment. In another embodiment, the transformations are stored in the photolithography system. In yet other embodiments, the transformations are stored in network storage accessible to network attached devices.

The method disclosed in FIG. 5 provides for detecting reference points and die locations for a substrate and calculating the local transformation of dies on a substrate and the global transformation for correcting the pattern placement of the dies on the substrate. The transformations are stored in a location accessible to other semiconductor equipment employed in the processing of the substrate. The method is usefully extended to processing of the substrate on semiconductor processing equipment. For example, the transformations may be used for adjusting or applying a mask when etching the substrate.

Figure 6:
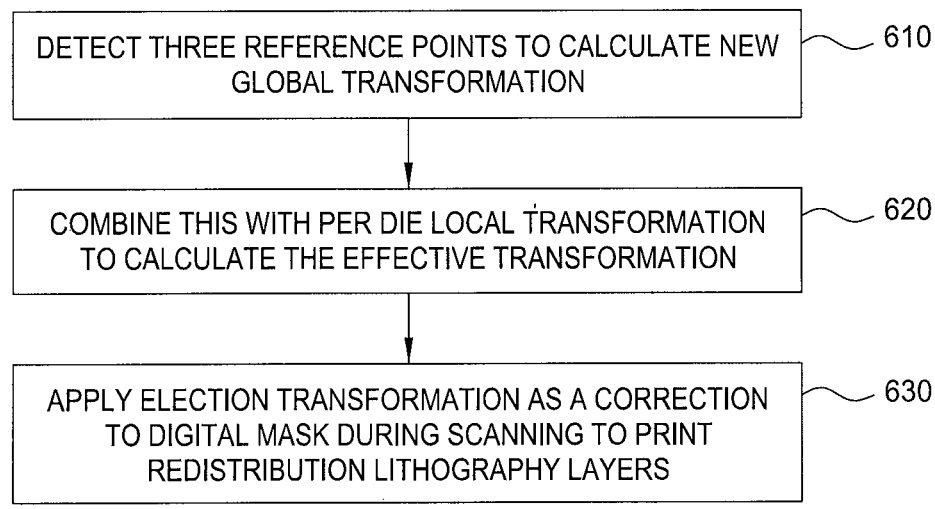
FIG. 6 depicts a method for creating an effective transformation for a lithography operation on the substrate.

FIG. 6 depicts a method for creating an effective transformation for a lithography operation on the substrate. At operation 610, at least three reference points are detected for calculating a new global transformation. The detection may be performed by a lithography tool, etch tool, or other suitable semiconductor processing tool in which the substrate is disposed. In one embodiment, a lithography tool detects at least the three reference points for calculating the new global transformation. The new global transformation calculated by the semiconductor processing tool may be different than the global transformation previously calculated by the metrology tool.

At operation 620, the new global transformation calculated by the processing tool is combined with the per die local transformation provided by the metrology tool for creating an effective transformation. The effective transformation being a combination of the per die skew and the profile of the substrate. The new global transformation may be calculated similarly to the methods disclosed above for calculating the global transformation provided by the metrology tool. For example, reference points, die location markers, points or vertices, or other suitable measured locations on the substrate may be used for modeling the profile of the substrate.

At operation 630, the effective transformation is applied as a correction to a digital mask of the processing tool. For example, the digital mask of a lithography tool may be skewed, rotated, stretched or otherwise modified by applying the effective transformation to the digital mask. During scanning to print redistribution lithography layers, the digital mask aligns with the actual die locations on the substrate to ensure features are formed correctly within the allowable critical dimensions.

The method described with reference to FIG. 6 may be used with a variety of semiconductor processing tools. The effective transformation of the digital mask is well suited for and provides for correction to a digital mask during photolithography scanning. Advantageously, the effective transformation aligns the per-die digital mask with a model based pattern placement correction and corrects warpage of the substrate along with the orientation of the die structure. The effective transformation corrects for the orientation of the die structure with the per-die digital mask alignment correction at the lithography tool prior to printing redistribution lithography layers on the die structure.

If the measured misplacement for the dies are repeatable from one substrate to another, i.e., is a repeatable a pattern shared by each substrate, offline characterization by the metrology tool can be made faster by measuring limited number of dies instead of all dies. This may also be performed in those cases when full accuracy isn't needed. If multiple dies are pick-and-placed as a group (die group), three measurement from each group is sufficient enough to calculate x/y rotation, expansion, and shift for the entire group. This increases characterization throughput by eliminating redundant measurements. The models generated remain the same except die becomes "die group" and the number of measurement sets correspond to the number of die groups instead of dies.

While the foregoing is directed to embodiments of the present invention, other and further embodiments of the invention may be devised without departing from the basic scope thereof, and the scope thereof is determined by the claims that follow.

The invention claimed is:

1. A method for correcting a pattern placement on a substrate, the method comprising:
   detecting three reference points for a substrate;
   detecting a plurality of sets of three die location points, each set indicative of an orientation of a die, the plurality of sets include a first set associated with a first die and a second set associated with a second die;
   calculating a local transformation for an orientation of the first die and the second die on the substrate;
   selecting three orientation points from the plurality of sets of three die location points wherein the orientation points are not members of the same set;
   calculating a first global transformation of the substrate from the selected three points from the set of points; and
   storing the first global transformation and the local transformation for the substrate.

2. The method of claim 1 further comprising:
   positioning the substrate in a lithography tool;
   detecting the three reference points;
   calculating a second global transformation from the three reference points;
   combining the second global transformation with the local transformation to calculate an effective transformation of the substrate; and
   applying the effective transformation as a correction to a digital mask during scanning.

3. The method of claim 2 further comprising:
   correcting for the orientation of the die structure by applying the effective transformation to generate a per-die digital mask alignment correction; and
   printing redistribution lithography layers on the die structure.

4. The method of claim 3 further comprising:
   aligning the per-die digital mask with a model based pattern placement correction; and
   correcting warpage of the substrate and orientation of the die structure.

5. The method of claim 1, wherein calculating the first global transformation of the substrate comprises:
   (a) measuring a value for an x/y rotation of the substrate,
   (b) measuring a value for an expansion of the substrate;
   (c) measuring a value for an orientation of the dies on the substrate; and
   (d) calculating the first global transformation from the values measured at (a), (b) and (c).

6. The method of claim 1, wherein selecting three points from the set of points comprises:
   selecting three alignment marks.

7. A non-transitory computer readable storage medium comprising a program product which, when executed, is configured to perform an operation for correcting a pattern placement on a substrate, the operation comprising:
   detecting three reference points for a substrate;
   detecting a plurality of sets of three die location points, each set indicative of an orientation of a die, the plurality of sets include a first set associated with a first die and a second set associated with a second die;
   calculating a local transformation for an orientation of the first die and the second on the substrate;
   selecting three orientation points from the plurality of sets of three die location points wherein the orientation points are not members of the same set;
   calculating a first global orientation of the substrate from the selected three points from the set of points; and
   storing the first global transformation and the local transformation for the substrate.

8. The non-transitory computer readable storage medium of claim 7 further comprising:
   positioning the substrate in a lithography tool;
   detecting the three reference points;
   calculating a second global transformation from the three reference points;
   combining the second global transformation with the local transformation to calculate an effective transformation of the substrate; and
   applying the effective transformation as a correction to a digital mask during scanning.

9. The non-transitory computer readable storage medium of claim 8 further comprising:
   correcting for the orientation of the die structure by applying the effective transformation to generate a per-die digital mask alignment correction; and
   printing redistribution lithography layers on the die structure.

10. The non-transitory computer readable storage medium of claim 9 further comprising:

aligning the per-die digital mask with a model based pattern placement correction; and correcting warpage of the substrate and orientation of the die structure.

11. The non-transitory computer readable storage medium of claim 7, wherein calculating the first global orientation of the substrate comprises:
(a) measuring a value for an x/y rotation of the substrate,
(b) measuring a value for an expansion of the substrate;
(c) measuring a value for an orientation of the dies on the substrate; and
(d) calculating the global transformation from the values measured at (a), (b) and (c).

12. The non-transitory computer readable storage medium of claim 7, wherein selecting three points from the set of points comprises:

selecting three alignment marks.

* * * * *